United States Patent
Watanabe et al.

(10) Patent No.: US 10,662,059 B2
(45) Date of Patent: May 26, 2020

(54) MICRO-ELECTRO-MECHANICAL-SYSTEMS PROCESSING METHOD, AND MICRO-ELECTRO-MECHANICAL-SYSTEMS PROCESSING APPARATUS

(71) Applicant: HITACHI, LTD., Chiyoda-ku, Tokyo (JP)

(72) Inventors: Keiji Watanabe, Tokyo (JP); Hiroyasu Shichi, Tokyo (JP); Misuzu Sagawa, Tokyo (JP); Toshiyuki Mine, Tokyo (JP); Daisuke Ryuzaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/015,640

(22) Filed: Jun. 22, 2018

(65) Prior Publication Data
US 2019/0062157 A1 Feb. 28, 2019

(30) Foreign Application Priority Data
Aug. 25, 2017 (JP) ................. 2017-161825

(51) Int. Cl.
*B81C 99/00* (2010.01)
*H01J 37/317* (2006.01)
(Continued)

(52) U.S. Cl.
CPC ...... *B81C 99/0025* (2013.01); *B81C 1/00412* (2013.01); *B81C 99/0065* (2013.01);
(Continued)

(58) Field of Classification Search
CPC ............ B81C 99/0025; B81C 1/00412; B81C 99/0065; B81C 2201/0143;
(Continued)

(56) References Cited

U.S. PATENT DOCUMENTS 8,207,513 B2  6/2012 Sasaki et al.
9,679,743 B2 * 6/2017 Fujii .................... H01J 37/222
(Continued)

FOREIGN PATENT DOCUMENTS

JP  2006-173035 A  6/2006
JP  2006-351994 A  12/2006

OTHER PUBLICATIONS

Office Action dated Oct. 16, 2019 in corresponding German Application No. 10 2018 211 873.6.

*Primary Examiner* — Shahed Ahmed
(74) *Attorney, Agent, or Firm* — Miles & Stockbridge, P.C.

(57) ABSTRACT

The invention is to reduce non-uniformity of a processing shape over a wide range of a single field-of-view.
The invention is directed to a method of processing micro electro mechanical systems with a first step and a second step in a processing apparatus including an irradiation unit that irradiates a sample with a charged particle beam, a shape measuring unit that measures a shape of the sample, and a control unit. In the first step, the irradiation unit irradiates a plurality of single field-of-view points with the charged particle beam in a first region of the sample, the shape measuring unit measures the shape of a spot hole formed in the first region of the sample, and the control unit sets, based on measurement results of the shape of the spot hole, a scan condition of the charged particle beam or a forming mask of the charged particle beam at each of the single field-of-view points. In the second step, the irradiation unit irradiates, based on the scan condition or the forming mask set in the first step, a second region of the sample with the charged particle beam.

8 Claims, 11 Drawing Sheets

(51) Int. Cl.
*H01J 37/304* (2006.01)
*H01J 37/147* (2006.01)
*G03F 7/20* (2006.01)
*B81C 1/00* (2006.01)
*H01J 37/305* (2006.01)

(52) U.S. Cl.
CPC ........ *G03F 7/2059* (2013.01); *H01J 37/1474* (2013.01); *H01J 37/304* (2013.01); *H01J 37/3056* (2013.01); *H01J 37/3174* (2013.01); *B81C 2201/0143* (2013.01); *B81C 2201/0159* (2013.01); *B81C 2201/0198* (2013.01); *H01J 2237/28* (2013.01); *H01J 2237/31749* (2013.01); *H01J 2237/31755* (2013.01); *H01J 2237/31776* (2013.01)

(58) Field of Classification Search
CPC .... B81C 2201/0159; B81C 2201/0198; B81C 99/003–005; G03F 7/2059; H01J 37/1474; H01J 37/304; H01J 37/3174; H01J 37/3056; H01J 2237/28; H01J 2237/31749; H01J 2237/31755; H01J 2237/31776; B81B 2201/04–047
See application file for complete search history.

(56) References Cited

U.S. PATENT DOCUMENTS

| | | | |
|---|---|---|---|
| 2004/0129351 A1* | 7/2004 | Iwasaki | C23C 16/047 148/508 |
| 2004/0131953 A1 | 7/2004 | Sugiyama et al. | |
| 2006/0038137 A1* | 2/2006 | Fujii | H01J 37/304 250/492.2 |
| 2006/0065854 A1 | 3/2006 | Shichi et al. | |
| 2006/0284115 A1* | 12/2006 | Kaneoka | H01J 37/28 250/492.21 |
| 2009/0230299 A1* | 9/2009 | Shichi | H01J 27/10 250/282 |
| 2014/0226003 A1* | 8/2014 | Phaneuf | H01J 37/222 348/80 |
| 2015/0009489 A1 | 1/2015 | Mulders et al. | |
| 2018/0226221 A1* | 8/2018 | Danilatos | H01J 37/1474 |

* cited by examiner

[FIG. 1]
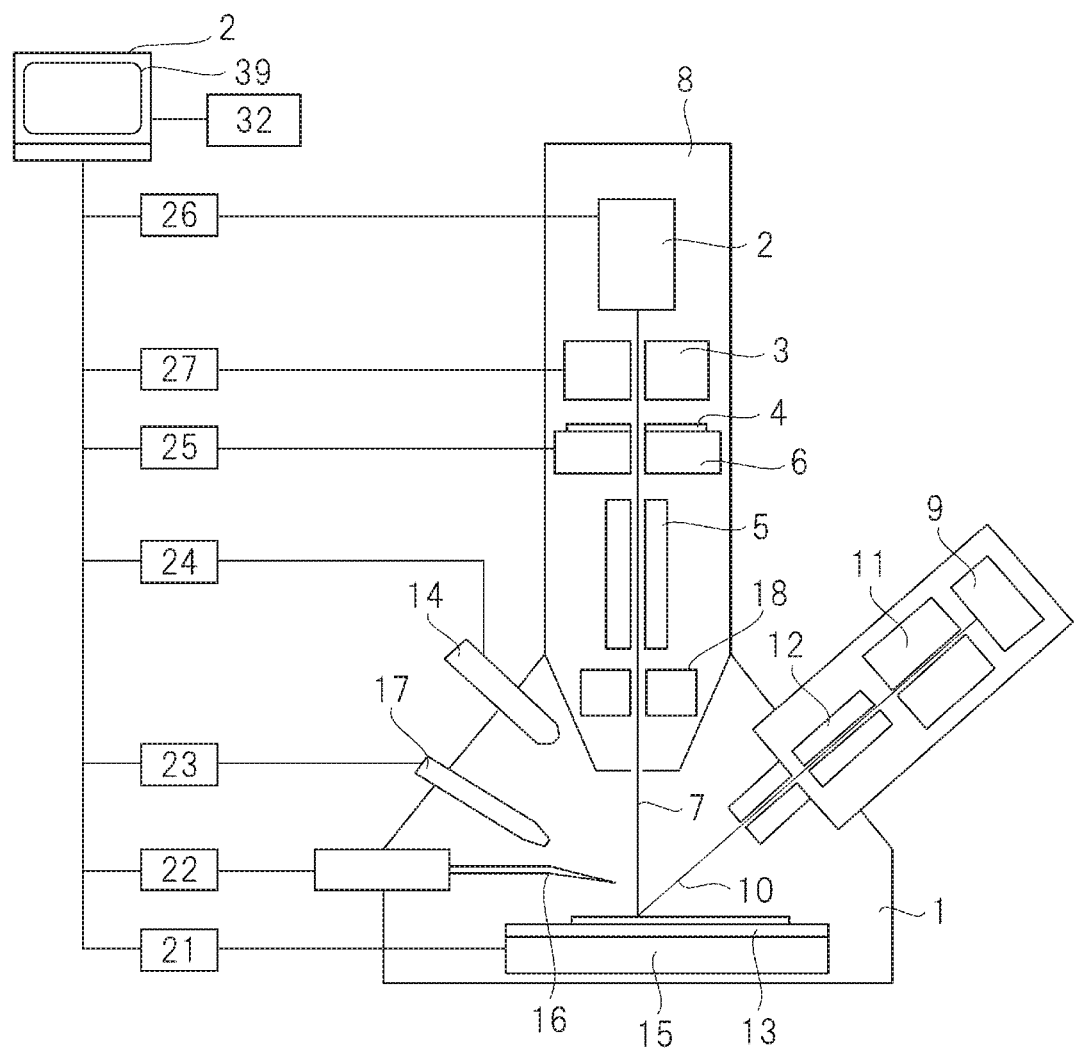

[FIG. 2]
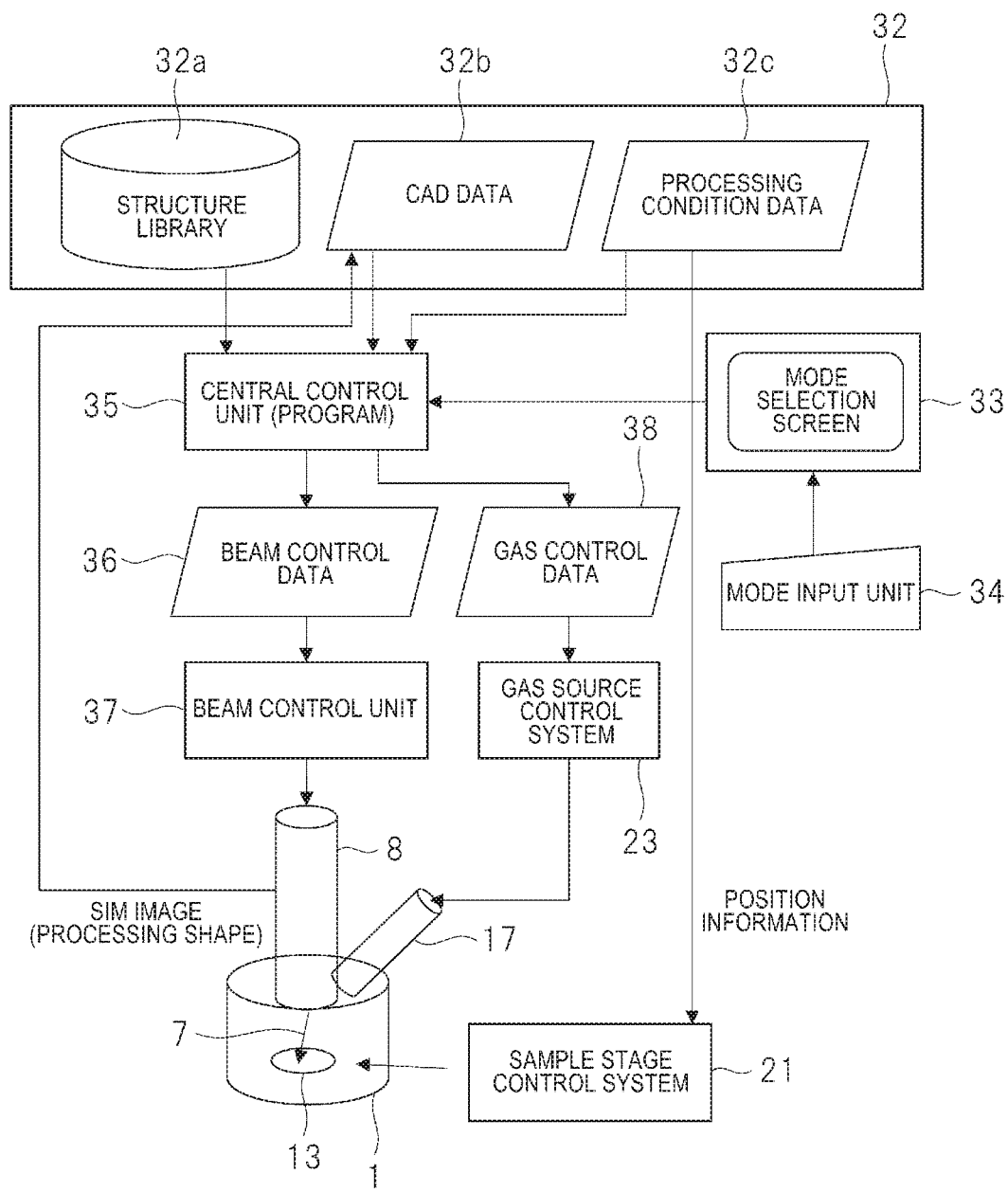

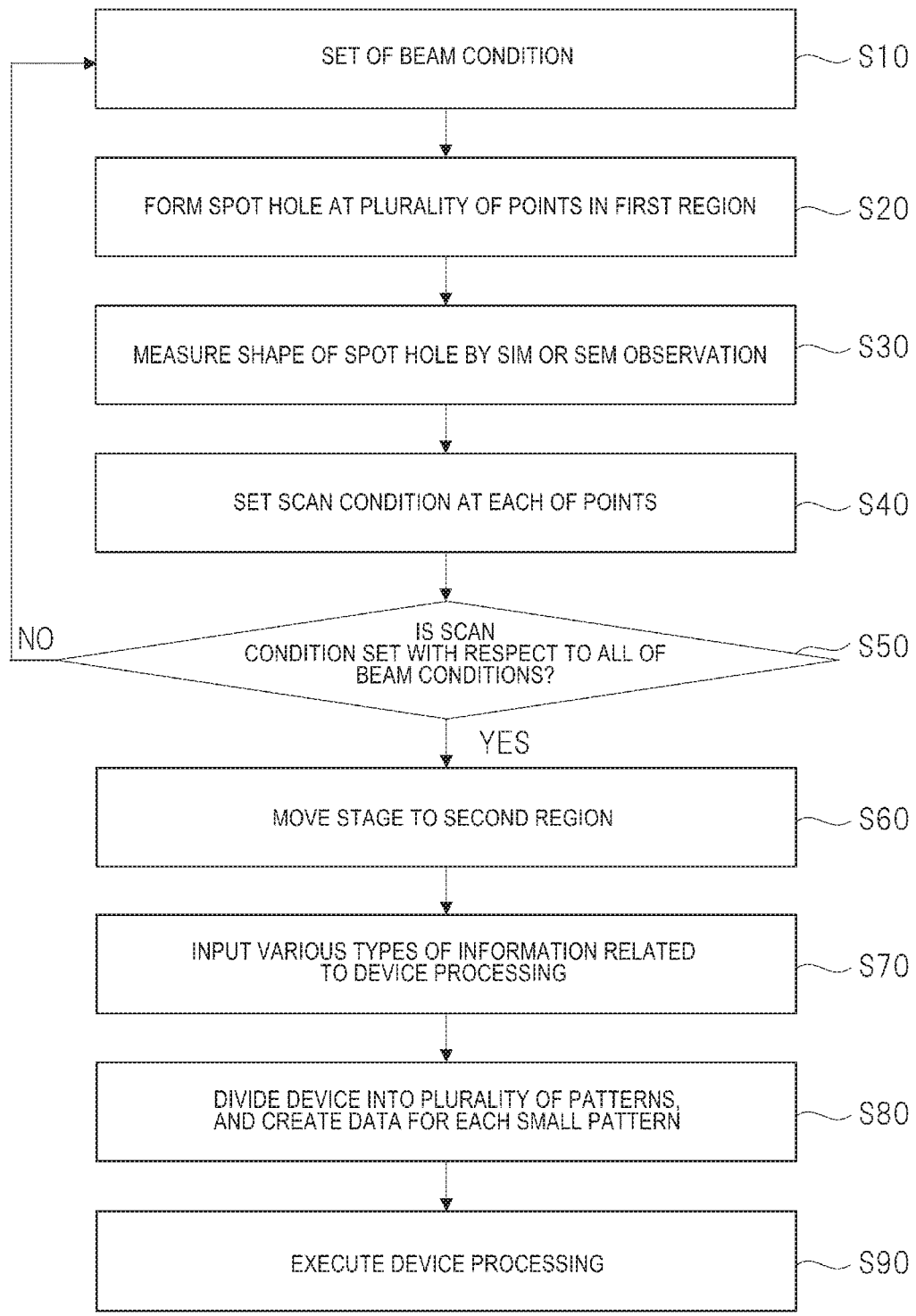
[FIG. 3]

[FIG. 4]
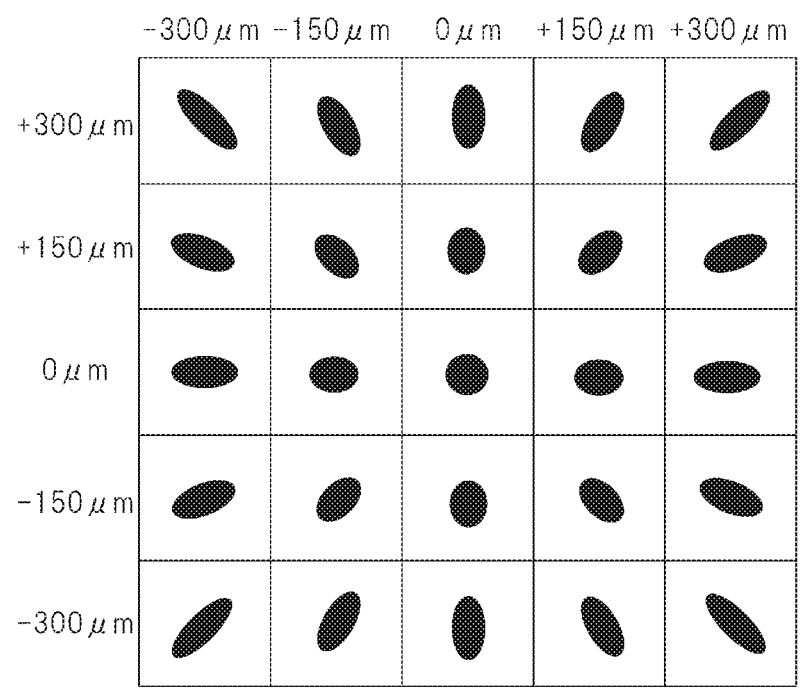
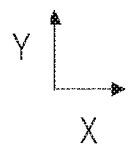

[FIG. 5] (a)
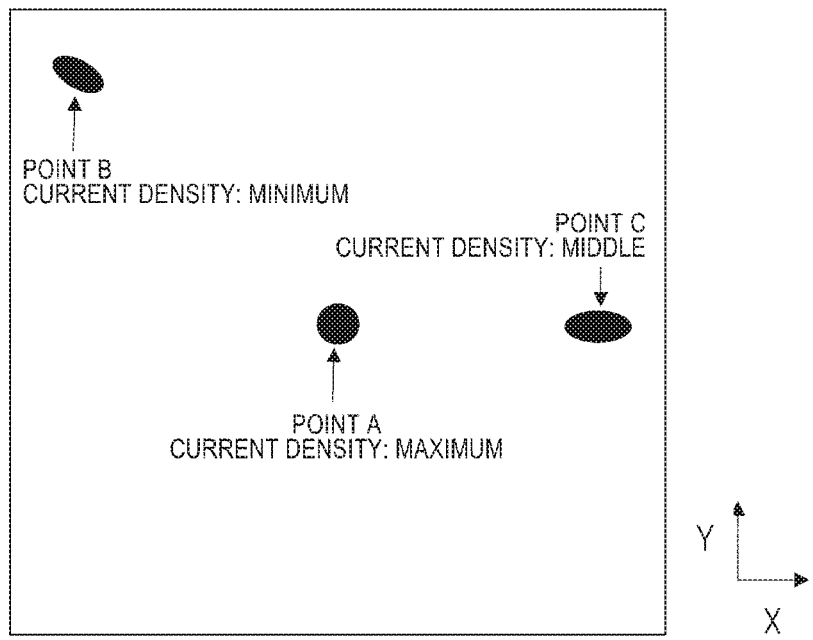
[FIG. 5] (b)
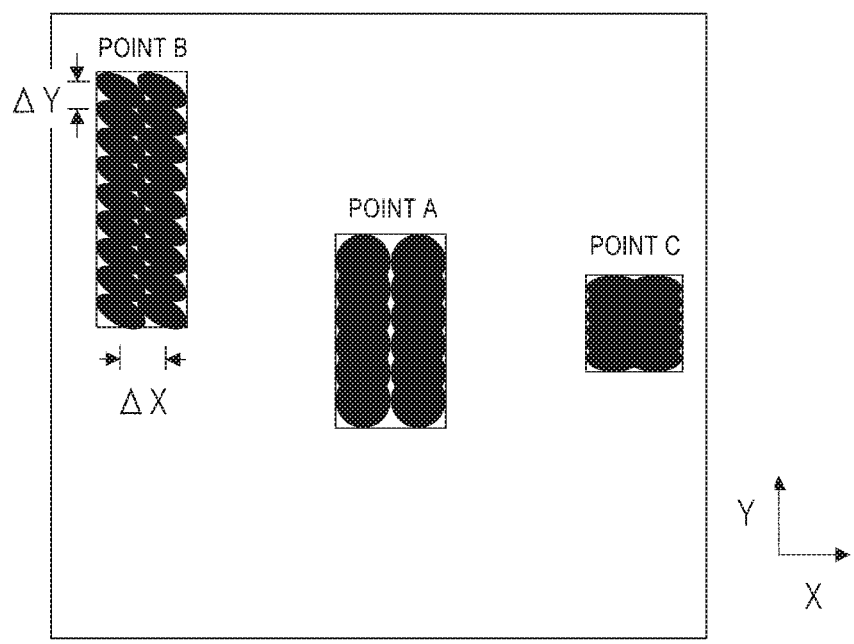

[FIG. 6]
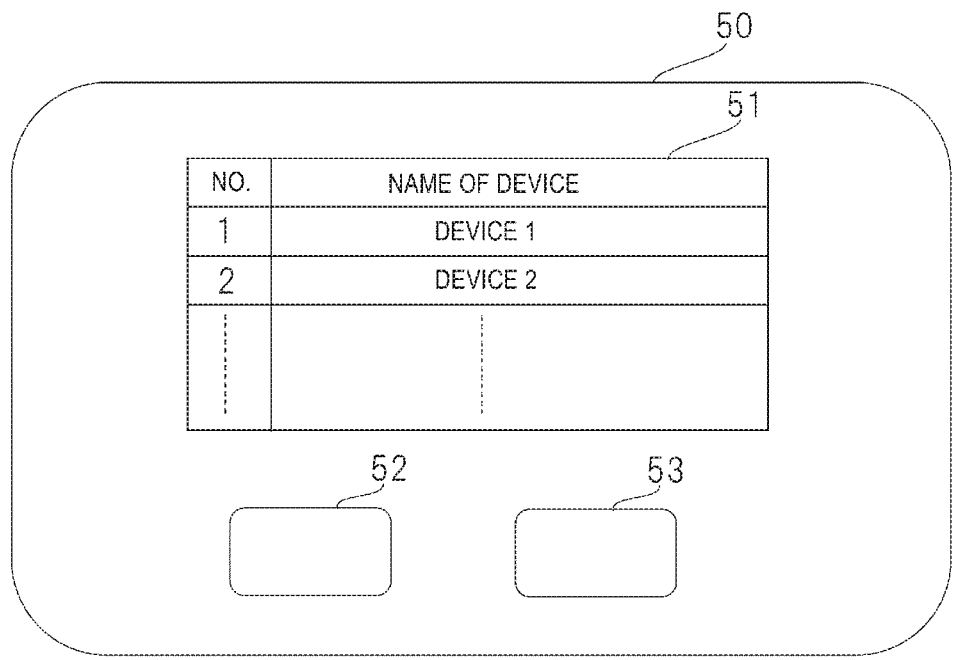
[FIG. 7]
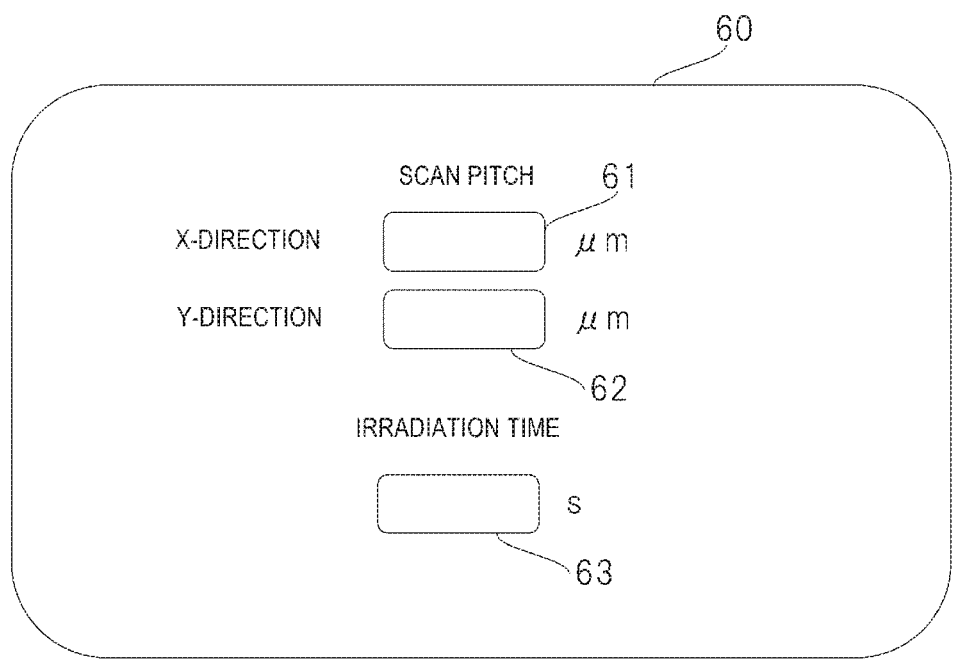

[FIG. 8]
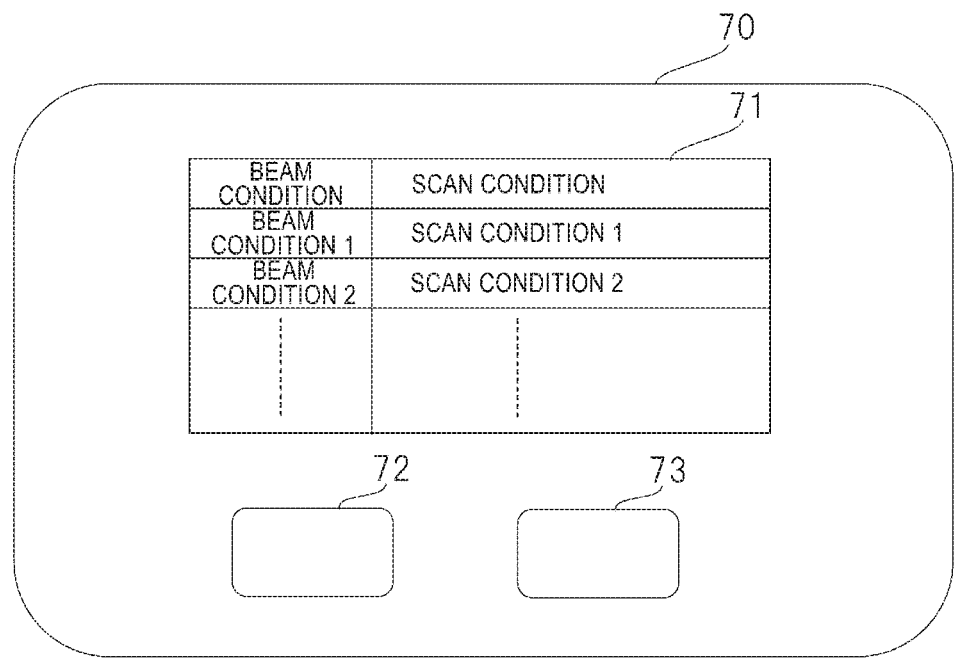

[FIG. 9] (a)
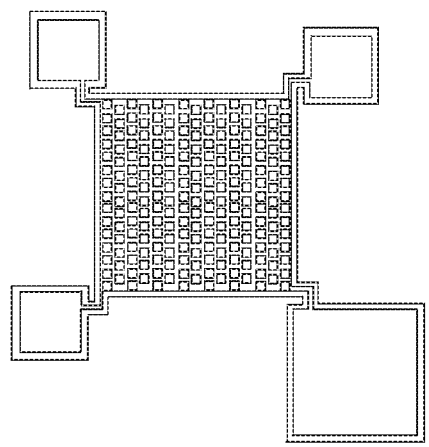
[FIG. 9] (b)
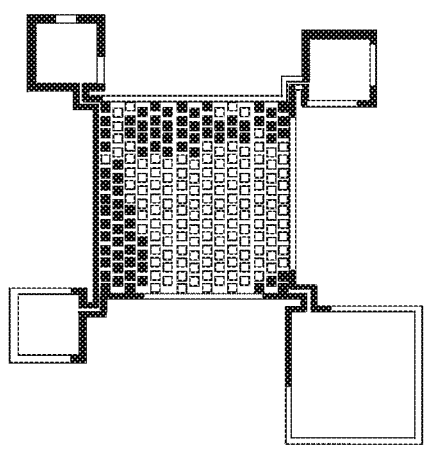

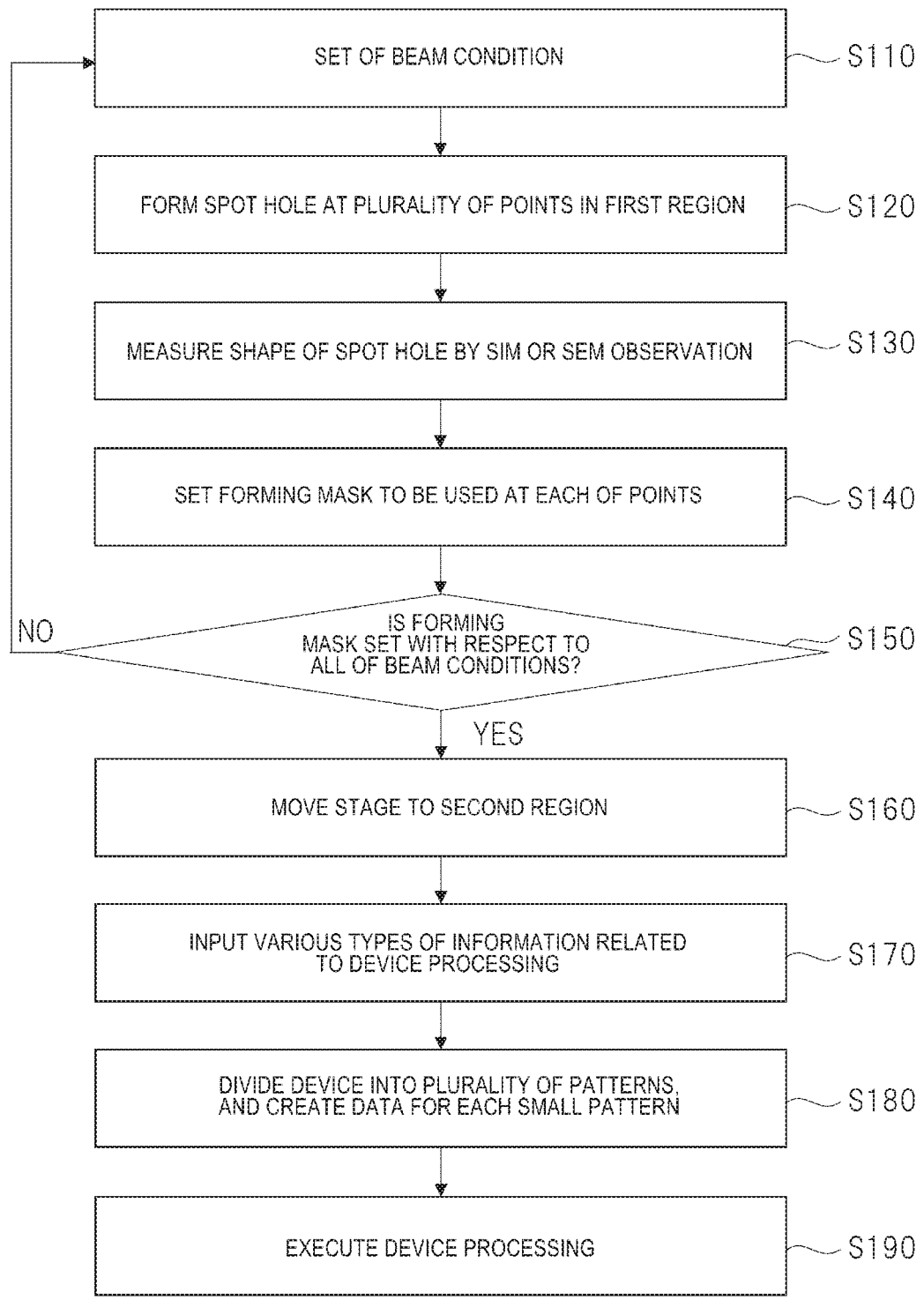

[FIG. 11]
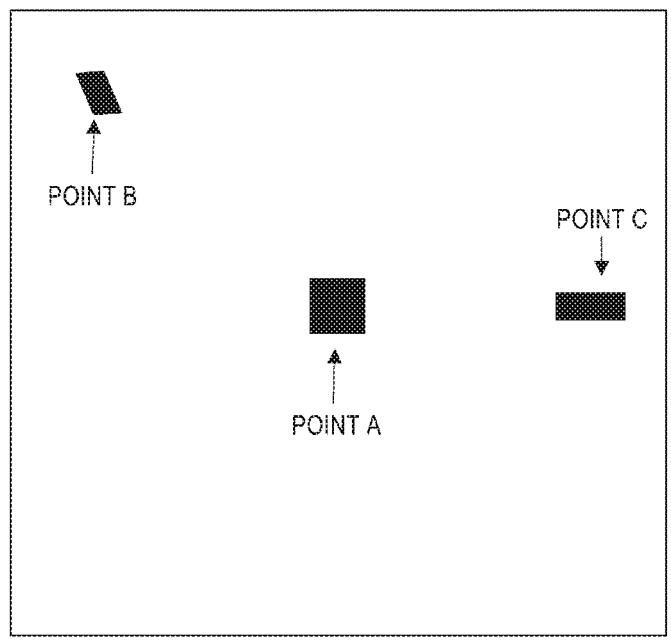

[FIG. 12]
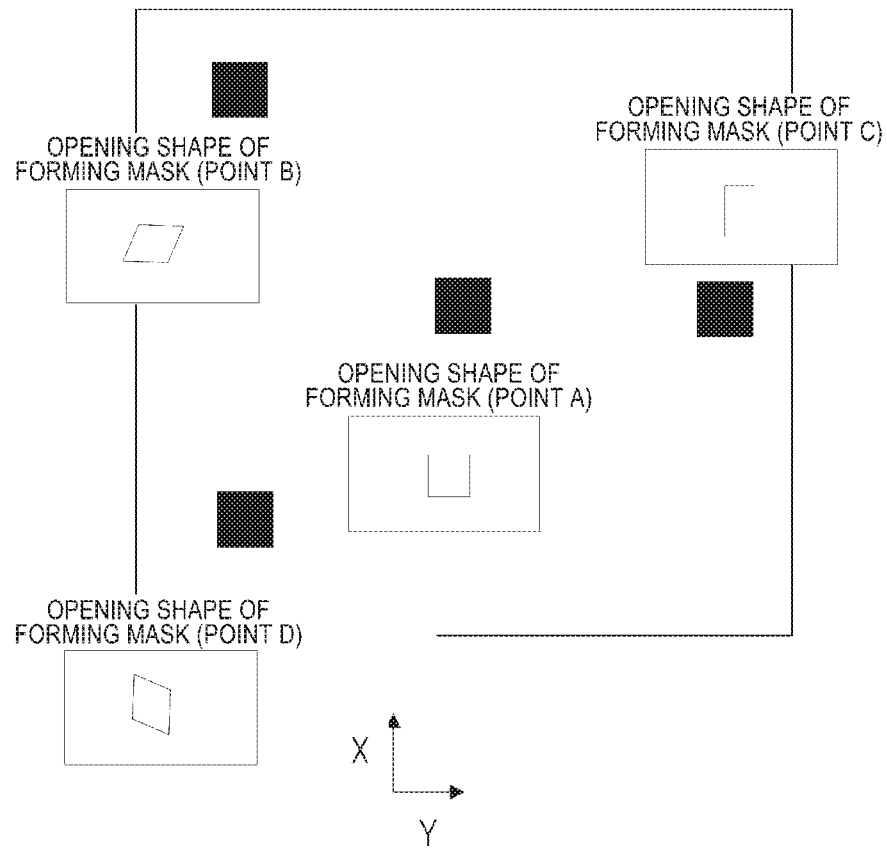
[FIG. 13]
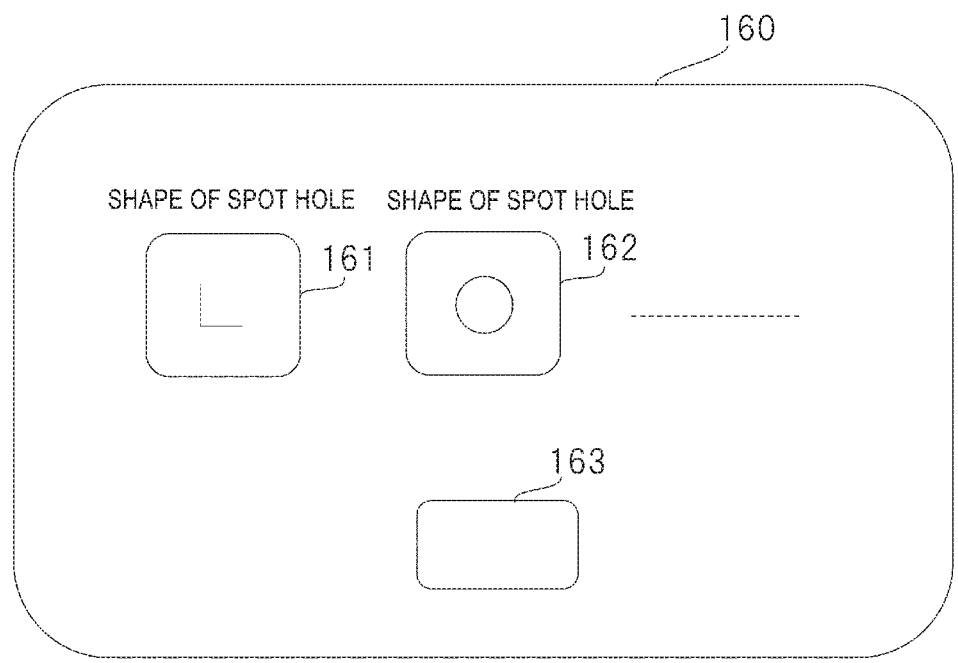

MICRO-ELECTRO-MECHANICAL-SYSTEMS PROCESSING METHOD, AND MICRO-ELECTRO-MECHANICAL-SYSTEMS PROCESSING APPARATUS

TECHNICAL FIELD

The present invention relates to a micro-electro-mechanical-systems processing method and a micro-electro-mechanical-systems processing apparatus.

BACKGROUND ART

Manufacture of micro electro mechanical systems (MEMS) using a focused ion beam (FIB) apparatus has been put to practical use. The focused ion beam apparatus processes micro-electro-mechanical-systems while irradiating a wide range of field-of-view with a focused ion beam.

By the way, in the focused ion beam apparatus, when a focused ion beam is deflected and the irradiation point of the focused ion beam is away from the center of the beam axis, distortion of the focused ion beam occurs. Due to such distortion of the focused ion beam, non-uniformity of the processing shape occurs.

Therefore, there is also a focused ion beam apparatus which has a function called dynamic focus, suppresses distortion of the focused ion beam in a single field-of-view, and reduces non-uniformity of the processing shape. The dynamic focus means setting optimal values of focus of the focused ion beam and stigmatic focus at each position in the single field-of-view point in advance and dynamically controlling the focus and the stigmatic focus during movement of the beam irradiation point.

For example, PTL 1 discloses a charged particle beam lithographic apparatus that realizes a lithographic apparatus in which there is no difference in line width between the x-direction and the y-direction regardless of deflection coma aberration and deflection chromatic aberration.

Specifically, the charged particle beam lithographic apparatus includes a beam correction unit for carrying out the dynamic focal correction and the dynamic astigmatic correction by adding respectively a focal deviation amount and an astigmatic deviation amount for eliminating the difference between the x-direction and the y-direction of beam blurring, caused by the deflection coma aberration and the deflection chromatic aberration, to a correction value for the dynamic focal correction and a correction value for the dynamic astigmatic correction.

Further, PTL 2 discloses a charged particle beam apparatus which has high resolving power and a wide scanning region (observation field-of-view).

Specifically, the charged particle beam apparatus includes a unit for adjusting the focus, a unit for adjusting astigmatism, a unit for controlling and detecting scanning positions, and a unit for controlling the focus adjustment and astigmatism adjustment at a time in conjunction with the scanning position.

CITATION LIST

Patent Literature

PTL 1: JP-A-2006-351994
PTL 2: JP-A-2006-173035

SUMMARY OF INVENTION

Technical Problem

In the single field-of-view, however, the distortion of the beam is suppressed by the dynamic focus only within a certain range from the center of the beam axis. For this reason, in the case of manufacturing the micro electro mechanical systems in a wide range, it is necessary to process while repeating stage movement and position adjustment in order to suppress the influence of non-uniformity of the processing shape. Then, the time required for manufacturing the micro electro mechanical systems increases, and thus manufacturing throughput decreases.

Therefore, an object of the present invention is to provide a micro-electro-mechanical-systems processing method and a micro-electro-mechanical-systems processing apparatus capable of reducing non-uniformity of a processing shape over a wide range of a single field-of-view.

Solution to Problem

The typical summary of the inventions disclosed in the present application will be briefly described as follows.

A micro-electro-mechanical-systems processing method according to typical embodiments of the present invention is a method of processing micro electro mechanical systems with a first step and a second step in a processing apparatus including an irradiation unit that irradiates a sample with a charged particle beam, a shape measuring unit that measures a shape of the sample, and a control unit. In the first step, the irradiation unit irradiates a plurality of single field-of-view points with the charged particle beam in a first region of the sample, the shape measuring unit measures the shape of a spot hole formed in the first region of the sample, and the control unit sets, based on measurement results of the shape of the spot hole, a scan condition of the charged particle beam or a forming mask of the charged particle beam at each of the single field-of-view points. In the second step, the irradiation unit irradiates, based on the scan condition or the forming mask set in the first step, a second region of the sample with the charged particle beam.

Advantageous Effects of Invention

The effects obtained by typical aspects of the present invention disclosed in the application will be briefly described below.

That is, according to a typical embodiment of the present invention, it is possible to reduce non-uniformity of a processing shape over a wide range of a single field-of-view.

BRIEF DESCRIPTION OF DRAWINGS

FIG. 1 is a configuration diagram illustrating an example of a device processing apparatus according to a first embodiment of the present invention.

FIG. 2 is an explanatory diagram illustrating an example of a software configuration of the device processing apparatus.

FIG. 3 is a flowchart illustrating an example of a device processing method according to the first embodiment of the present invention.

FIG. 4 is a diagram schematically illustrating an example of a shape of a spot hole formed in each of single field-of-view points according to the first embodiment of the present invention.

FIGS. 5(a) and 5(b) are process diagrams illustrating an example of a setting method of scan information according to the first embodiment of the present invention.

FIG. 6 is a diagram illustrating an example of an input screen for various types of information on device processing according to the first embodiment of the present invention.

FIG. 7 is a diagram illustrating an example of an input screen for various types of information on device processing according to the first embodiment of the present invention.

FIG. 8 is a diagram illustrating an example of an input screen for various types of information on device processing according to the first embodiment of the present invention.

FIGS. 9(a) and 9(b) are diagrams illustrating processing uniformity of a manufactured device.

FIG. 10 is a flowchart illustrating an example of a device processing method according to the first embodiment of the present invention.

FIG. 11 is a diagram schematically illustrating an example of a shape of a spot hole formed in each of single field-of-view points according to a second embodiment of the present invention.

FIG. 12 is a diagram illustrating an example of a shape of a forming mask formed in each of the single field-of-view points according to the second embodiment of the present invention.

FIG. 13 is a diagram illustrating an example of an input screen for various types of information on device processing according to the first embodiment of the present invention.

DESCRIPTION OF EMBODIMENTS

Embodiments of the present invention will be described below with reference to the drawings. Note that the same components are denoted by the same reference numerals throughout all the drawings for describing the embodiments, and the repetitive description thereof will be omitted.

First Embodiment

<Configuration of Device Processing Apparatus>

FIG. 1 is a configuration diagram illustrating an example of a configuration of a device processing apparatus according to a first embodiment of the present invention.

The device processing apparatus (micro-electro-mechanical-systems processing apparatus) of the present embodiment includes an FIB apparatus illustrated in FIG. 1. The FIB apparatus includes a vacuum chamber 1, and the vacuum chamber 1 is disposed therein with an ion beam irradiation system (irradiation unit) including an ion source 2 for emitting ions (charged particles), a condenser lens 3, a beam limit aperture 4, an ion beam scanning deflector 5, an aperture rotating mechanism 6, and an object lens 18, for example. The ion beam irradiation system is irradiated with an ion beam (a charged particle beam) 7. The ion beam irradiation system is also referred to as an FIB lens barrel 8.

An example of the ion source 2 includes, for example, a liquid metal ion source and a plasma ion source. The liquid metal ion source emits a gallium ion, and the ion beam irradiation system is irradiated with a gallium ion beam. The plasma ion source emits an argon ion or a xenon ion, and the ion beam irradiation system is irradiated with an argon ion beam or a xenon ion beam.

In addition, the FIB apparatus is disposed with an electron beam irradiation system including an electron gun 9, an electron lens 11 for focusing an electron beam 10 emitted from the electron gun 9, and an electron beam scanning deflector 12, for example. Further, the FIB apparatus includes a sample 13, a secondary particle detector 14, a sample stage 15, a probe (manipulator) 16, and a gas source 17 for introducing a source gas (deposition gas) during film deposition or a gas for promote etching during cutting to the vacuum chamber 1. Here, the sample 13 is a substrate such as a semiconductor wafer on which a plurality of MEMS structures (MEMS devices) are formed.

Thus, the device processing apparatus of the present embodiment is provided with the ion beam irradiation system and the secondary particle detector 14, and thus the secondary particle detector 14 can be used for acquisition of a SIM (Scanning Ion Microscope) image. The device processing apparatus of the present embodiment is also provided with the electron beam irradiation system, and thus the secondary particle detector 14 can be used for acquisition of a SEM (Scanning Electron Microscope) image. That is, the secondary particle detector 14 functions as a shape measuring unit that measures a shape of a spot hole formed in the sample 13.

Further, the device processing apparatus of the present embodiment includes a sample stage control system 21, a manipulator control system 22, a gas source control system 23, a secondary particle detector control system 24, an aperture rotation control mechanism 25, an ion source control system 26, a lens control system 27, and a calculation processor 31 which control the FIB apparatus, and a storage system which stores a database 32. The device processing apparatus of the present embodiment includes a computer that is provided with the calculation processor 31 and the storage system for storing the database 32.

The sample stage 15 includes a linear movement mechanism in two orthogonal directions in a sample mounting surface, a linear movement mechanism in a direction perpendicular to the sample mounting surface, a rotation mechanism in the sample mounting surface, and an inclination mechanism having an inclined axis in the sample mounting surface, and these mechanisms are controlled by the sample stage control system 21 according to a command from the calculation processor 31.

The ion beam irradiation system includes a forming mask for forming of the ion beam 7. The forming mask is provided between the ion beam scanning deflector 5 and the aperture rotating mechanism 6, and is attached to the aperture rotating mechanism 6, for example. In addition, the ion beam irradiation system may be provided with a plurality of forming masks having different opening shapes. Further, the forming masks are disposed so as to be rotatable relative to a beam axis and can be rotated freely according to irradiation spots of the ion beam 7. The forming mask to be used and a rotation angle of the forming mask are controlled by the aperture rotation control mechanism 25 and the like.

The calculation processor (control unit) 31 includes, for example, an information input unit through which a user of the apparatus inputs necessary information and a display (display unit) 39 that displays an image generated based on a detection signal of the secondary particle detector 14 or information input by the information input unit. The information input unit includes, for example, a mode input unit 34 illustrated in FIG. 2 to be described below. The display 39 displays, for example, a mode selection screen 33 illustrated in FIG. 2 to be described below.

The display 39 also displays a device selection screen 50 to be described below, and accepts an input of a selection of a device to be manufactured. Further, the display 39 displays scan condition input screens 60 and 70 to be described, and accepts scan conditions and beam conditions.

In addition, the calculation processor 31 implements a software function unit such as a central control unit 35 illustrated in FIG. 2 to be described below. The database 32 stores, for example, a structure library 32a, CAD (Computer-Aided Design) data 32b, and processing condition data 32c which are illustrated in FIG. 2 to be described below.

In the FIB apparatus, the ions emitted from the ion source 2 are focused as the ion beam 7 on the sample 13 by the condenser lens 3 and the object lens. In this way, the ion beam 7, which is the charged particle beam, includes the focused spot beam. Focusing conditions are set by the input to the calculation processor 31. In addition, a beam diameter of the ion beam 7 irradiated on the sample 13 is determined by an image formed on the sample 13 using the ion source 2 as a light source and an aberration due to the condenser lens 3 or the like. The aberration due to the condenser lens 3 increases as the opening of the beam limit aperture 4 becomes larger, resulting in increasing the beam diameter.

A software configuration of the device processing apparatus described above will be described below with reference to FIG. 2. FIG. 2 is an explanatory diagram illustrating an example of the software configuration of the device processing apparatus.

As illustrated in FIG. 2, the FIB apparatus of the device processing apparatus includes, for example, the database 32, the mode selection screen 33, the mode input unit 34, the central control unit 35, a beam control unit 37 for controlling based on beam control data 36, a gas source control system 23 for controlling based on gas control data 38, and the sample stage control system 21 for controlling based on position information. The beam control unit 37 includes, for example, the aperture rotation control mechanism 25, the ion source control system 26, and lens control system 27.

The central control unit 35 includes a processing control program for constructing the software configuration of the device processing apparatus. The processing control program includes, for example, a program for implementing a function of measuring the shape of the spot hole formed on the sample 13 based on the captured SIM or SEM image, in addition to a program for automatically performing the device processing.

In addition, the database 32 stores various data, for example, the structure library 32a, the CAD data 32b such as design data of the shape and dimension of the MEMS structure, and the processing condition data 32c related to a processing position and a processing condition of the MEMS structure.

In the device processing apparatus, for example, prior to the execution of the device processing, the structure library 32a, the CAD data 32b, and the processing condition data 32c are input from the information input unit of the calculation processor 31 by the operator, and are stored in the database 32.

At the time of the device processing, the operator selects a device processing method on the mode selection screen 33 through the mode input unit 34 of the calculation processor 31. The device processing method includes a device processing method of the first embodiment and a device processing method of a second embodiment to be described below.

Then, the central control unit 35 of the calculation processor 31 refers to the structure library 32a, the CAD data 32b, and the processing condition data 32c stored in the database 32, based on the sequence of the device processing method selected on the mode selection screen 33, and creates the beam control data 36 and the gas control data 38.

The beam control data 36 and the gas control data 38 created by the central control unit 35 are sent to the beam control unit 37 and the gas source control system 23, respectively. Then, the beam control unit 37 controls the ion beam irradiation system disposed in the FIB lens barrel 8 of the FIB apparatus, based on the beam control data 36. Further, the gas source control system 23 controls, based on the gas control data 38, the gas source 17. At this time, the sample stage control system 21 controls, based on the position information included in the processing condition data 32c, the sample stage 15.

During the device processing, the processing shape of the SIM image acquired by the secondary particle detector 14 is stored as the CAD data 32b in the database 32, and the central control unit 35 calculates an integration profile based on the processing shape, and feeds back into the sample stage control system 21, the beam control unit 37, and the gas source control system 23.

<Device Processing Method>

A device processing method (micro-electro-mechanical-systems processing method) according to the present embodiment will be described below. In a first step of the device processing method according to the present embodiment, first, an ion beam (charged particle beam) 7 is irradiated onto a first region of the sample 13 to measure a shape of a spot hole formed in the first region, and scan conditions of the ion beam are set for each of single field-of-view points based on the measurement result. In a second step, based on the set scan condition, the ion beam 7 is irradiated onto a second region of the sample 13, whereby micro electro mechanical systems are formed.

These steps will be described below. FIG. 3 is a flowchart illustrating an example of the device processing method according to the first embodiment of the present invention. In the device processing, steps S10 to S90 are executed as illustrated in FIG. 3. Steps S10 to S50 are executed in the first step, and steps S60 to S90 are executed in the second step.

<<Step S10>>

First, in step S10, beam conditions are set. Here, the beam conditions are referred to as various conditions related to the ion beam 7, for example, a current value of the ion beam 7.

For example, the calculation processor 31 causes the central control unit 35 to execute a program for the device processing and to display a beam condition input screen on the display 39. The operator inputs various conditions such as the current value of the ion beam 7 to the beam condition input screen displayed on the display 39. The central control unit 35 generates beam control data 36 based on the input current value, and outputs the generated beam control data 36 to the beam control unit 37.

<<Step S20>>

In step S20, the ion beam 7 is irradiated to a plurality of single field-of-view points in the first region of the sample 13. The sample stage control system 21 moves the sample 13 to a predetermined position such that the first region of the sample 13 faces the beam irradiation system. The first region of the sample 13 may be a test region of the beam, for example, may be set in the vicinity of an end of the sample, and may be set at a place adjacent to the second region where the micro-electro-mechanical-systems is processed. Alternatively, when a plurality of micro electro mechanical systems are processed in the sample 13, the first region may be set between a plurality of second regions adjacent to each other. When the first region is set at a place close to sample 13, the sample 13 is less distorted between the first region and the second region, and thus the surface uniformity of the processing can be further improved with respect to the micro-electro-mechanical-systems to be processed.

FIG. 4 is a diagram schematically illustrating an example of the shape of a spot hole formed in each of the single field-of-view points according to the first embodiment of the present invention. FIG. 4 illustrates an example in which the ion beam 7 is irradiated to a center (X=0 μm, Y=0 μm) of the beam axis and points deviated by 150 μm in an X-direction and a Y-direction from the center of the beam axis. Specifically, the ion beam irradiation system irradiates points (25 points) deviated by, for example, 150 μm in the range of ±300 μm in the X-direction and ±300 μm in the Y-direction around the beam axis, as illustrated in FIG. 4, with the ion beam 7. At this time, the current value of the ion beam 7 to be irradiated is fixed to a current value set in step S10.

The ion beam irradiation system may irradiate the first region with the ion beam 7 formed by the forming mask. As seen in the spot holes formed around the beam axis, the shape of the ion beam 7 not to be formed by the forming mask is substantially circular. Using the forming mask, the ion beam 7 is formed into a predetermined shape corresponding to the shape of the opening of the forming mask.

<<Step S30>>

In step S30, the shape of the spot hole formed by the ion beam 7 is measured. For example, the secondary particle detector 14 acquires an image (SIM image) of the first region of the sample 13, using a secondary electron image obtained when the ion beam irradiation system irradiates with the ion beam 7. In addition, the secondary particle detector 14 may acquire an image (SEM image) of the first region of the sample 13, using a secondary electron image obtained when the electron beam irradiation system irradiates the sample with the electron beam. The secondary particle detector 14 transmits the acquired image to the CAD data 32b of the database 32 through the secondary particle detector control system 24, and stores the image.

The central control unit 35 reads the image related to the first region of the sample 13 from the CAD data 32b, and identifies the shape of the spot hole in each of the single field-of-view points. Further, the central control unit 35 calculates an opening area of the spot hole at each point based on the read image.

As illustrated in FIG. 4, since the beam is not distorted at the center (X=0 μm, Y=0 μm) of the beam axis, the shape of the spot hole is circular. On the other hand, since the beam is distorted at a point away from the center from the beam axis, the shape of the spot hole is elliptical. In addition, as the distance from the center of the beam axis increases, the shape of the spot hole is an elongated elliptical shape. As illustrated in the drawings, the opening area of the spot hole is smallest at the center, and increases as the distance from the center of the beam axis increases.

For example, at four corners (X=300 μm, Y=300 μm), (X=300 μm, Y=−300 μm), (X=−300 μm, Y=−300 μm), and (X=−300 μm, Y=300 μm) illustrated in FIG. 4, the shape of the spot hole is the longest elliptical shape.

<<Step S40>>

In step S40, scan conditions of the ion beam 7 at each of the single field-of-view points are set. FIGS. 5(a) and 5(b) are process diagrams illustrating an example of a scan information setting method according to the first embodiment of the present invention. FIG. 5(a) is a diagram illustrating a current density at each of the single field-of-view points, and FIG. 5(b) is a diagram illustrating a scan pitch and an irradiation time at each of the points.

The central control unit 35 calculates, based on the opening area of the spot hole and the current value of the ion beam 7, a current density at the time of forming the spot hole at each of the points, (see FIG. 5(a)). The current values of the ion beam 7 are defined by the above-described beam conditions and are common at the respective points. For this reason, the current density at each of the points depends on the opening area.

Then, the central control unit 35 sets an irradiation pitch (scan pitch) of the ion beam 7 at each of the points, based on the shape of the spot hole. For example, as illustrated in FIG. 5(b), the central control unit 35 respectively sets a scan pitch (ΔX) in the X-direction and a scan pitch (ΔY) in the Y-direction. For example, the central control unit 35 may set scan pitches in the respective directions such that adjacent spot holes overlap with each other in the Y-direction and do not overlap with each other in the X-direction as indicated by a point A illustrated in FIG. 5(b), and may set scan pitches in the respective direction such that adjacent spot holes do not overlap with each other in both directions as indicated by a point B. In addition, the central control unit 35 may set scan pitches in the respective direction such that adjacent spot holes overlap with each other in both directions as indicated by a point C.

It is also stated that the scan pitch may be set such that the adjacent spot holes do not overlap with each other. This is because the ion beam 7 is mainly irradiated to the spot hole part and the ion beam 7 is also irradiated to the peripheral part thereof although only slightly. Thus, a part, where the spot holes do not overlap with each other in FIG. 5(b), is also processed by the ion beam 7.

Next, the central control unit 35 sets the irradiation time of the ion beam at each of the points based on the calculated current density. For example, the central control unit 35 sets the irradiation time longer at a point where the current density is low and sets the irradiation time shorter at a point where the current density is high, thereby making a current amount uniform at each of the single field-of-view points.

Further, the central control unit 35 calculates the ratio of the scan pitch and the irradiation time at each of the single field-of-view points to the scan pitch and the irradiation time at the center of the beam axis of the ion beam 7. The central control unit 35 stores the respective ratios of the set scan pitch and irradiation time and the calculated scan pitch and irradiation time in the processing condition data 32c, for example.

The central control unit 35 sets scan pitch and irradiation time at a single field-of-view point irradiated with the ion beam 7, based on the scan pitch and the irradiation time at the single field-of-view point irradiated with the ion beam 7. For example, the central control unit 35 may set the same scan condition as the scan condition of the closest point, where the scan condition is set, as a scan condition for the corresponding point, may proportionately divide the scan conditions at the plurality of closest points, where the scan condition is set, according to the distances to the respective points, thereby calculating the scan condition at the corresponding point. In addition, the central control unit 35 also calculates the ratio of the scan pitch and the irradiation time at the center of the beam axis with respect to the scan condition set or calculated in this way, and stores the ratio in the processing condition data 32c.

When the ion beam 7 formed into a predetermined shape by the forming mask is irradiated, the central control unit 35 sets a scan pitch and an irradiation time when the same forming mask is used. The central control unit 35 also calculates the ratio of the scan pitch and the irradiation time at the center of the ion beam 7 with respect to the scan condition set in this way.

<<Step S50>>

In step S50, it is determined whether the scan conditions are set for all the beam conditions. When the scan conditions are not set corresponding to all the beam conditions, the process returns to step S10, scan conditions are set for each of the single field-of-view points based on new beam conditions. In this way, the processes in S10 to S40 are repeated in the present embodiment until the scan conditions are set corresponding to all the set beam conditions.

On the other hand, when the scan conditions are set corresponding to all the beam conditions, the process of step S60 is executed.

<<Step S60>>

In step S60, the sample stage control system 21 moves the sample 13 to a predetermined position such that the second region of the sample 13 faces the ion beam irradiation system.

<<Step S70>>

In step S70, various types of information on the device processing are input to the device processing apparatus. FIGS. 6 to 8 are diagrams illustrating an example of an input screen of various types of information on the device processing according to the first embodiment of the present invention. FIG. 6 is a diagram illustrating an example of a selection screen of a device (micro-electro-mechanical-systems) to be manufactured, and FIG. 7 is a diagram illustrating an example of an input screen of a scan condition. FIG. 8 is a diagram illustrating another example of an input screen of the scan condition.

The central control unit 35 displays the device selection screen 50 illustrated in FIG. 6 on the display 39. As illustrated in FIG. 6, the device selection screen 50 includes, for example, a device list 51 that is associated with a device number and is managed by a structure library 32a, a device number input box 52, and an input decision button 53. The central control unit 35 may create the device list 51 immediately before displaying it on the display 39, and may also create the device list 51 when each device is registered.

The operator searches the device list 51 for the device to be manufactured, and inputs the device number corresponding to the device to be manufactured to the device number input box 52. Then, the selection of the device to be manufactured is completed when the operator clicks or touches the decision button 53.

Next, the central control unit 35 displays the scan condition input screen 60 illustrated in FIG. 7 on the display 39. The scan condition input screen 60 includes, for example, an X-direction scan pitch input box 61, a Y-direction scan pitch input box 62, an illumination time input box 63, and an input decision button 64. The operator inputs X-direction and Y-direction scan pitches at the center of the beam axis and an illumination time of the ion beam 7 into these input boxes 61 to 63. Then, when the operator clicks or touches the input decision button 64, the input of the X-direction and Y-direction scan pitches and the irradiation time is completed. The scan condition input screen 60 may include a beam condition input box (not illustrated). Thus, the scan condition and the beam condition can be input from the scan condition input screen 60.

In addition, the scan condition input screen 70 illustrated in FIG. 8 includes, for example, a scan condition list 71 in which the beam condition and the scan condition are associated with each other, a beam condition input box 72, and an input decision button 73. The central control unit 35 may create the scan condition list 71 immediately before displaying it on the display 39, and may create the scan condition list 71 when the scan condition is set by each of the beam conditions.

The operator inputs the number corresponding to the selected beam condition into the beam condition input box 72, and the input of the beam condition and the scan condition is completed when the operator clicks or touches the input decision button 73.

<<Step S80>>

In step S80, specific data related to the device processing is created based on various types of information input in step S70.

Based on the input device number, the central control unit 35 refers to the structure library 32a, the CAD data 32b, and the processing condition data 32c included in the database 32, and reads various types of information on the selected device. Further, the central control unit 35 reads the ratio of the scan condition at each of the single field-of-view points which is calculated in step S40.

Then, the central control unit 35 generates the beam control data 36 for the device processing based on various types of information on the device and the ratio of the scan condition and the scan condition. Further, the central control unit 35 may generate the gas control data 38 together with the beam control data 36 according to the shape of the device to be manufactured.

In the case of manufacturing a device larger than the processing size in the single field-of-view point, the central control unit 35 divides the manufactured device into a plurality of parts, and generates the beam control data 36 and the gas control data 38 for the device processing corresponding to each of the parts, based on various types of information on the device and the ratio of the scan condition and the scan condition.

The central control unit 35 outputs the generated beam control data 36 to the beam control unit 37, and outputs the generated gas control data 38 to the gas source control system 23.

<<Step S90>>

In step S90, the device processing is executed based on the beam control data 36 and the gas control data 38 output from the central control unit 35. When the ion beam 7 shaped by the forming mask is irradiated at the time of the setting of the scan condition, the device processing is performed by irradiating with the ion beam 8 shaped by the forming mask even in the case of the device processing.

FIGS. 9(a) and 9(b) are diagrams illustrating an example of processing uniformity of the manufactured device. FIG. 9(a) illustrates processing uniformity of the device manufactured by the method of the present embodiment, and FIG. 9(b) illustrates processing uniformity of the device manufactured by the conventional method. The processing uniformity is indicated by shading of color, and deeply processed parts are indicated darkly.

As illustrated in FIG. 9(a), the device manufactured by the method of the present embodiment is almost uniformly processed. In contrast, the device manufactured by the conventional method is not uniformly processed as illustrated in FIG. 9(b), in which deeply processed parts and shallowly processed parts are mixed.

<Effects According to Present Embodiment>

According to the present embodiment, after the scan conditions at each of the single field-of-view points are set in the first region of the sample 13 in the first step, the device is manufactured based on the set scan conditions in the second step.

With this configuration, since the device is manufactured by the ion beam in which the scan conditions are adjusted, it is possible to reduce non-uniformity of the processing shape over a wide range of the single field-of-view. Further, even when the device larger than the size of the single field-of-view is manufactured, it is possible to reduce non-uniformity of the processing shape throughout the device.

Further, according to the present embodiment, the central control unit 35 sets, as the scan condition, the scan pitch and the irradiation time of the ion beam at each of the single field-of-view points, based on the measurement result of the shape of the spot hole. With this configuration, since the device is manufactured based on the set scan pitch and irradiation time, it is possible to reduce non-uniformity of the processing shape over a wide range of the single field-of-view.

According to the present invention, the central control unit 35 calculates the ratio of the scan pitch and the irradiation time at each of the single field-of-view points with respect to the scan pitch and the irradiation time at the center of the beam axis. With this configuration, when only the scan pitch and the irradiation time at the center of the beam axis are specified during the device processing, since the scan pitch and the irradiation time at each of the single field-of-view points are defined, the load of the central control unit 35 is reduced.

In addition, according to the present embodiment, the central control unit 35 calculates, based on the scan pitch and the irradiation time set at each of the points, the scan pitch and the irradiation time at the points not irradiated with the ion beam. With this configuration, since the number of the single field-of-view points irradiated with the ion beam can be reduced, it is possible to shorten the time required for the first step. Thus, the time until the device is completely manufactured is also shortened.

Further, according to the present invention, in the first step, the ion beam is irradiated under the plurality of beam conditions and the central control unit 35 sets the scan conditions corresponding to the respective beam conditions. With this configuration, since the device is manufactured with appropriate scan conditions according to the shape of the device, it is possible to further reduce non-uniformity of the processing shape at the single field-of-view.

According to the present embodiment, in the first step, the central control unit 35 sets the scan condition when the ion beam is irradiated using the forming mask, and in the second step, the device is manufactured using the same forming mask as in the first step. With this configuration, since the ion beam can be shaped into an arbitrary shape, it is possible to further reduce non-uniformity of the processing shape at the single field-of-view and to perform appropriate processing according to the shape of the device.

Further, according to the present embodiment, the secondary particle detector 14 measures the shape of the spot hole by the secondary electron image obtained by the irradiation of the ion beam from the ion beam irradiation system or the electron beam irradiation system. With this configuration, since the ion beam or the electron beam for the device processing can be used for the shape of the spot hole, it is possible to measure the shape of the spot hole in detail and to prevent an increase in the number of components of the device processing apparatus.

In addition, according to the present embodiment, the charged particle beam includes the focused spot beam. With this configuration, it is possible to prevent the diffusion of the charged particle beam and to accurately manufacture the device.

Further, according to the present embodiment, the charged particle beam includes the ion beam. With this configuration, since the mass of the charged particle forming the beam is reduced, it is possible to make the depth of focus shallow during the device processing. This makes it possible to perform further accurate processing, whereby the accuracy of the device processing can be further improved.

Second Embodiment

A second embodiment of the present invention will be described below. In the following embodiments, a detailed description will not be presented as a rule with respect to portions overlapping with the above-described embodiment. In the present embodiment, a forming mask used in a second step is set according to the shape of a spot hole measured in a first step.

<Device Processing Apparatus>

In the present embodiment, an ion beam irradiation system includes a mask rotation unit that rotates a forming mask against a beam axis. The mask rotation unit is provided, for example, in an aperture rotating mechanism 6. The mask rotation unit rotates the forming mask based on a rotation angle (to be described below) set in a central control unit 35.

A display 39 displays a spot-hole-shape selection screen 160 to be described below, and accepts the input of the shape of the spot hole at the center of the beam axis.

<Device Processing Method>

A device processing method according to the present embodiment will be described. FIG. 10 is a flowchart illustrating an example of the device processing method according to the second embodiment of the present invention. As illustrated in FIG. 10, steps S110 to S190 are executed in the device processing. Steps S110 to S150 are executed in a first step, and steps S160 to S190 are executed in a second step.

<<Step S110>>

In step S110, beam conditions related to an ion beam 7 are set as in step S10 illustrated in FIG. 3. Further, in step S110, a forming mask to be used during irradiation of the ion beam 7 is set. The set forming mask may be included in the beam conditions. Here, it is assumed that a forming mask with an opening shape of square is set.

<<Step S120>>

In step S120, a plurality of single field-of-view points are irradiated with the ion beam 7 in a firsts region of a sample 13 using the forming mask according to the beam conditions set in step S110.

<<Step S130>>

In step S130, the shape of the spot hole formed by the ion beam 7 is measured based on an SIM image or an SEM image.

FIG. 11 is a diagram schematically illustrating an example of the shape of the spot hole formed at each of the single field-of-view points according to the second embodiment of the present invention. FIG. 11 illustrates an example of a case where the center (X=0 µm, Y=0 µm) of the beam axis and points surrounding the center of the beam axis are irradiated with the ion beam 7.

As illustrated in FIG. 11, the shape of the spot hole is substantially square at the center (point A) of the beam axis. On the other hand, the shape of the spot hole is rectangular at a right point (point C) with respect to the center of the beam axis. In addition, the shape of the spot hole is a parallelogram at an upper left point (point B) with respect to the center of the beam axis. These shapes illustrated in FIG.

11 are merely one example, and depend on the opening shape of the set forming mask.

<<Step S140>>

In step S140, a forming mask to be used at each of the single field-of-view points is set based on the measurement result of the shape of the spot hole. For example, the central control unit 35 selects, based on the measurement result of the shape of the spot hole, a forming mask for forming a spot hole having the same shape as the center of the beam axis of the ion beam with respect to each of the single field-of-view points. Specifically, the central control unit 35 refers to the shapes of the spot holes formed using the respective forming masks in the device processing until the previous time. Then, the central control unit 35 selects a desired shape (for example, a shape of the center of the beam axis) with respect to each of the single field-of-view points, and set the forming mask, which forms the spot hole closest to this shape, as a forming mask to be used in the second step.

In addition, the central control unit 35 may refer to the spot holes formed by a plurality of forming mask in the present device processing, and may set a forming mask to be used at each of the single field-of-view points.

FIG. 12 is a diagram illustrating an example of the shape of the forming mask set at each of the single field-of-view points according to the second embodiment of the present invention. As illustrated in FIG. 12, a mask equal to the forming mask used in the first region is set at a point A. Further, a forming mask having a rectangular opening shape in which an opening diameter is shorter in a direction toward the beam axis is set at a point C. In addition, a forming mask having an opening shape of parallelogram is set at a point B. Further, at an upper left point (point D) with respect to the center of the beam axis, the forming mask set at the point B is set and is further set to be used in a state of being rotated by 90° which is a predetermined rotation angle. In this way, the central control unit 35 sets the forming mask and the rotation angle at each of the points. Thus, the number of forming masks to be used can be reduced.

The central control unit 35 generates forming mask correspondence information, in which the forming mask to be used at each of the single field-of-view points and the rotation angle are associated with each other, for each of the shapes of the spot holes formed around the beam axis, and stores the generated information in the database 32.

In step S140, the scam conditions described in the above-described first embodiment may be set in addition to the forming masks used in each of the single field-of-view points. The setting of the scan conditions is already described, so a detailed description will not be presented.

<<Step S150>>

In step S150, it is determined whether the forming mask is set for all the beam conditions. In step S150, it is determined whether the shapes of the spot holes formed by all usable forming masks have been measured.

When the forming masks corresponding to all the beam conditions are not set or the shapes of the spot holes formed by all the usable forming masks are not measured, the process returns to step S10, and a forming mask to be used at each of the single field-of-view points is set based on new beam conditions. Alternatively, after the shape of the spot hole formed by another forming mask is measured, the forming mask used at each of the single field-of-view points is set.

<<Step S160>>

In step S160, the sample stage control system 21 moves the sample 13 to a predetermined position such that a second region of the sample 13 faces the ion beam irradiation system.

<<Step S170>>

In step S170, various types of information on the device processing are input to the device processing apparatus. The following description will be made with respect to the process after the device to be manufactured is selected.

FIG. 13 is a diagram illustrating an example of an input screen of various types of information on the device processing according to the first embodiment of the present invention. FIG. 13 illustrates an example of a spot-hole-shape selection screen 160 used to select the shape of the spot hole at the center of the beam axis. The central control unit 35 displays the device selection screen 160 illustrated in FIG. 13 on the display 39. As illustrated in FIG. 13, the spot-hole-shape selection screen 160 includes, for example, a plurality of spot-hole-shape selection buttons 161 and 162 and a selection decision button 163.

The operator selects the shape of the spot hole at the center of the beam axis from the displayed spot-hole-shape selection screen 160, and touches or clicks the spot-hole-shape selection button 161 or 162 corresponding to the selected shape. Then, when the operator clicks or touches the selection decision button 163, the selection of the shape of the spot hole is completed.

The central control unit 35 may display, for example, the scan condition input screens 60 or 70 illustrated in FIG. 7 or 8 on the display 39, and accept the input of the scan condition.

<<Step S180>>

In step S180, specific data relating to the device processing is created based on various types of information input in step S70. The central control unit 35 refers to predetermined forming mask correspondence information, based on the input shape of the spot hole at the center of the beam axis. In addition, the central control unit 35 generates, based on the input device number and the forming mask correspondence information, the beam control data 36 for the device processing. In the present embodiment, the gas control data 38 may also be generated together with the beam control data 36.

When the scan conditions are input, the central control unit 35 generates the gas control data 38 together with the beam control data 36 based on the input device number, the forming mask correspondence information, and the scan conditions.

The central control unit 35 outputs the generated beam control data to the beam control unit 37, and outputs the generated gas control data 38 to the gas source control system 23.

<<Step S190>>

In step S190, the device processing is executed based on the beam control data 36 and the gas control data 38 which are output from the central control unit 35.

<Effects According to Present Embodiment>

According to the present embodiment, the following effects can be obtained in addition to the effects according to the above-described embodiment. According to the present embodiment, based on the measurement result of the shape of the spot hole, the forming mask for forming a spot hole having the same shape as the center of the beam axis of the ion beam 7 is selected with respect to each of the single field-of-view points. With this configuration, since the shapes of the spot holes formed by the ion beam 7 can be made uniform, it is possible to manufacture a device with a more accurate shape.

In addition, according to the present embodiment, in the first step, the spot holes are formed using the plurality of forming masks. With this configuration, since the forming mask to be used for trial is selected based on the shape of the spot hole formed immediately before, it is possible to further improve the processing accuracy of the device.

In addition, according to the present embodiment, since the forming mask and the scan conditions can be set with respect to each of the single field-of-view points, it is possible to further improve the processing accuracy of the device.

Further, according to the present embodiment, the central control unit 35 sets the same forming mask with respect to the plurality of points having substantially the same distance from the center of the beam axis, and sets the rotation angle with respect to the beam axis for each point. With this configuration, since the number of forming masks to be used can be suppressed, it is possible to prevent an increase in the number of components of the device processing apparatus.

It should be noted that the present invention is not limited to the above-described embodiments, but includes various modified examples. Further, it is possible to replace part of elements of an embodiment with elements of another embodiment, and it is also possible to add elements of an embodiment to elements of another embodiment. Also, it is possible to perform addition, deletion, and replacement of part of elements of each embodiment with other elements. Each member and the relative size illustrated in the drawings are simplified and idealized in order to easily understand the present invention, and may become more complicated in terms of mounting.

Preferred embodiments of the present invention will be described below.

[Note 1]

A micro-electro-mechanical-systems processing apparatus including:
an irradiation unit that irradiates a sample with a charged particle beam;
a shape measuring unit that measures a shape of the sample; and
a control unit, wherein
the irradiation unit includes a plurality of forming masks for forming the charged particle beam, and irradiates a plurality of single field-of-view points with the charged particle beam using the same forming masks in a first region of the sample,
the shape measuring unit measures the shape of a spot hole formed in the first region of the sample,
the control unit selects, based on the measurement results of the shape of the spot hole, the forming mask for forming the spot hole having a shape equivalent to the center of the beam axis of the charged particle beam with respect to each of the single field-of-view points, and
the irradiation unit irradiates a second region of the sample with the charged particle beam while switching the forming mask with respect to each of the single field-of-view points.

[Note 2]

The micro-electro-mechanical-systems processing apparatus according to Note 1, wherein
the irradiation unit irradiates each of the single field-of-view points with the charged particle beam using a plurality of forming masks in the first region of the sample,
the shape measuring unit measures the shape of the spot hole corresponding to each of the forming masks, and
the control unit selects the shape of the spot hole at the center of the beam axis of the charged particle beam, and forms, based on the measurement results of the shape of the spot hole corresponding to each of the forming mask, the spot hole having a shape equivalent to the selected shape of the spot hole with respect to each of the single field-of-view points.

[Note 3]

The micro-electro-mechanical-systems processing apparatus according to Note 1, wherein
the control unit sets, based on the measurement results of the shape of the spot hole, a scan condition of the charged particle beam at each of the single field-of-view points, and
the irradiation unit irradiates the sample with the charged particle beam based on the set scan condition and the forming mask.

[Note 4]

The micro-electro-mechanical-systems processing apparatus according to Note 1, wherein
the control unit sets the same forming mask with respect to the plurality of points having substantially the same distance from the center of the beam axis of the charged particle beam, and sets a rotation angle with respect to the beam axis.

[Note 5]

The micro-electro-mechanical-systems processing apparatus according to Note 4, wherein
the irradiation unit a mask rotation unit that rotates the forming mask against a beam axis, and
the mask rotation unit rotates the forming mask based on the rotation angle set in the control unit.

REFERENCE SIGNS LIST

6: aperture rotating mechanism
7: ion beam
8: FIB lens barrel
9: electron gun
13: sample
14: secondary particle detector
24: secondary particle detector control system
31: calculation processor
32: database
35: central control unit
39: display
50: device selection screen
60, 70: scan condition input screen
36: beam control data
37: beam control unit
160: spot-hole-shape selection screen

The invention claimed is:

1. A micro-electro-mechanical-systems processing method, comprising:
in a first step,
irradiating a plurality of single field-of-view points with a charged particle beam in a first region of a sample;
measuring a shape of a spot hole formed in the first region of the sample; and
setting, based on measurement results of the shape of the spot hole, a scan condition of the charged particle beam or a forming mask of the charged particle beam at each of the single field-of-view points; and in a second step,
irradiating, based on the scan condition or the forming mask set in the first step, a second region of the sample with the charged particle beam.

2. The micro-electro-mechanical-systems processing method according to claim 1, wherein
the first step further comprises setting, as the scan condition, a scan pitch and an irradiation time of the charged particle beam at each of the single field-of-view points based on the measurement results of the shape of the spot hole.

3. The micro-electro-mechanical-systems processing method according to claim 2, wherein
the first step further comprises calculating a ratio of the scan pitch and the irradiation time at each of the single field-of-view points to the scan pitch and the irradiation at a center of a beam axis of the charged particle beam.

4. The micro-electro-mechanical-systems processing method according to claim 2,
wherein the first step further comprises setting, as the scan condition, the scan pitch and the irradiation time of the charged particle beam at the single field-of-view point not irradiated with the charged particle beam, based on the scan pitch and the irradiation time of the charged particle beam at the single field-of-view point irradiated with the charged particle beam.

5. The micro-electro-mechanical-systems processing method according to claim 4,
wherein the first step further comprises calculating a ratio of the scan pitch and the irradiation time at the single field-of-view point not irradiated with the charged particle to the scan pitch and the irradiation time at the center of the beam axis of the charged particle beam.

6. The micro-electro-mechanical-systems processing method according to claim 1,
wherein the first step further comprises:
irradiating each of the single field-of-view points with the charged particle beam under a plurality of beam conditions; and
setting the scan condition corresponding to each of the plurality of beam conditions.

7. The micro-electro-mechanical-systems processing method according to claim 1, wherein
in first step further comprises:
irradiating the first region with the charged particle beam formed by the forming mask; and
setting the scan condition in a case of using the same forming mask; and
in second step further comprises:
irradiating the second region of the sample with the charged particle beam formed by the same forming mask as in the first step.

8. The micro-electro-mechanical-systems processing method according to claim 1, wherein
in first step further comprises measuring the shape of the spot hole by a secondary electron image obtained by irradiation of the charged particle beam from the irradiation unit.

* * * * *